United States Patent
Brown et al.

(10) Patent No.: US 10,734,498 B1
(45) Date of Patent: Aug. 4, 2020

(54) METHOD OF MAKING A DUAL-GATE HEMT

(71) Applicant: HRL Laboratories, LLC, Malibu, CA (US)

(72) Inventors: David F. Brown, Thousand Oaks, CA (US); Jeong-Sun Moon, Moorpark, CA (US); Yan Tang, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 16/101,294

(22) Filed: Aug. 10, 2018

Related U.S. Application Data (60) Provisional application No. 62/571,737, filed on Oct. 12, 2017.

(51) Int. Cl.
*H01L 29/66* (2006.01)
*H01L 29/20* (2006.01)
*H01L 29/423* (2006.01)
*H01L 21/285* (2006.01)
(Continued)

(52) U.S. Cl.
CPC .. *H01L 29/66462* (2013.01); *H01L 21/28581* (2013.01); *H01L 21/28587* (2013.01); *H01L 29/0891* (2013.01); *H01L 29/2003* (2013.01); *H01L 29/42316* (2013.01); *H01L 29/778* (2013.01)

(58) Field of Classification Search
CPC ......... H01L 29/66462; H01L 21/28581; H01L 21/28587; H01L 29/0891; H01L 29/2003; H01L 29/42316; H01L 29/778
See application file for complete search history.

(56) References Cited

U.S. PATENT DOCUMENTS

| 7,405,443 B1 * | 7/2008 | Zuniga ................. H01L 29/402 257/328 |
| 9,379,327 B1 * | 6/2016 | Rutherglen ......... H01L 51/0023 |
| 2005/0006639 A1 | 1/2005 | Dupuis |

(Continued)

OTHER PUBLICATIONS

Moon, J.S. et al., "70% Power-Added-Efficiency Dual-Gate, Cascode GaN HEMTs Without Harmonic Tuning", IEEE Electron Device Letters, vol. 37, No. 3, Mar. 2016.

(Continued)

*Primary Examiner* — Fernando L Toledo
*Assistant Examiner* — Neil R Prasad
(74) *Attorney, Agent, or Firm* — Ladas & Parry (57) ABSTRACT

A four-terminal GaN transistor and methods of manufacture, the transistor having source and drain regions and preferably two T-shaped gate electrodes, wherein a stem of one of the two T-shaped gate electrodes is more closely located to the source region than it is to a stem of the other one of the two T-shaped gate electrodes and wherein the stem of the other one of the two T-shaped gate electrodes is more closely located to the drain region than it is to the stem of said one of the two T-shaped gate electrodes. The the gate closer to the source region is a T-gate, and the proximity of the two gates is less than 500 nm from each other. The spacing between the stem of the RF gate and source region and the stem of the DC gate and drain region are preferably defined by self-aligned fabrication techniques. The four-terminal GaN transistor is capable of operation in the W-band (75 to 100 GHz).

14 Claims, 8 Drawing Sheets

(51) Int. Cl.
*H01L 29/778* (2006.01)
*H01L 29/08* (2006.01)

(56) References Cited

U.S. PATENT DOCUMENTS

| | | | |
|---|---|---|---|
| 2005/0077538 A1 | 4/2005 | Heikman | |
| 2006/0244011 A1 | 11/2006 | Saxler | |
| 2007/0001239 A1* | 1/2007 | Deleonibus | H01L 21/26586 257/408 |
| 2009/0026501 A1 | 1/2009 | Maher | |
| 2010/0301395 A1* | 12/2010 | Xu | H01L 29/7784 257/194 |
| 2012/0248416 A1* | 10/2012 | Zhou | B82Y 10/00 257/29 |
| 2014/0361343 A1 | 12/2014 | Sriram | |
| 2017/0330940 A1* | 11/2017 | Lee | H01L 21/76898 |

OTHER PUBLICATIONS

U.S. Appl. No. 16/217,714, Moon, filed Dec. 12, 2018.
PCT International Search Report and Written Opinion from PCT/US2018/065291 dated Apr. 22, 2019.
Cao, Y., et al., "Radio frequency transistors using aligned semiconducting carbon nanotubes with current-gain cutoff frequency and maximum oscillation frequency simultaneously greater than 70 GHz", ACS Nano, vol. 10, pp. 6782-6790, 2016.
Chu, S.L.G., et al., "A highly linear MESFET", IEEE MTT-S Digest, 1991, pp. 725-728.
Hur, K. Y., "Ultralinear double pulse doped AlInAs/GaInAs/InP HEMTs", Electronics Letters, vol. 32, No. 16, pp. 1516-1518, 1996.
Ikalainen, P. K., "Low noise, low DC power linear FET", Microwave Conference, 1992, pp. 570-575.
Iwamoto, M., et al., "Linearity characteristics of GaAs HBTs and the influence of collector design", IEEE Transactions Microwave Theory and Techniques, vol. 48, No. 12, p. 2377-2388, Dec. 2000.
Moon, J.-S., et al., 2016 IEEE Topical Conference on Power Amplifiers for Wireless and Radio Applications (PAWR), pp. 5-7 (2016).
Moon, J.S., et al., "Linearity of low microwave noise AlGaN/GaN HEMTs", Electronics Letters, vol. 38, pp. 1358-1359, 2002.
Palacios, T., et al., "Use of Double-Channel Heterostructures to Improve the Access Resistance and Linearity in GaN-Based HEMTs," IEEE Transaction Electron Devices, vol. 53, No. 3., pp. 562-565, 2006.
Park, P., et al., "Electron gas dimensionality engineering in AlGaN/GaN high electron mobility transistors using polarization," Applied Physics Letters, vol. 100, pp. 063507-01 to 063507-03, 2012.
Rajan, S. et al., Cao, Y., et al., "Radio frequency transistors using aligned semiconducting carbon nanotubes with current-gain cutoff frequency and maximum oscillation frequency simultaneously greater than 70 GHz", ACS Nano, vol. 10, pp. 6782-6790, 2016.
AlGaNÕGaN polarization-doped field-effect transistor for microwave power applications, Applied Physics Letters, vol. 84, No. 9, pp. 1591-1593, Mar. 2004.
Zhang, K., et all, "High-linearity AlGaN/GaN FinFETs for microwave power applications", IEEE Electron Device Letters, vol. 38, No. 5, pp. 615-618, May 2017.

* cited by examiner

METHOD OF MAKING A DUAL-GATE HEMT

CROSS REFERENCE TO RELATED APPLICATIONS

This application claims the benefit of U.S. Provisional Patent Application Ser. No. 62/571,737 filed on 12 Oct. 2017 and entitled "Highly Scaled Dual-Gate GaN HEMT", the disclosure of which is hereby incorporated herein by reference.

This application is related to U.S. Provisional Patent Application Ser. No. 62/630,688 filed on 14 Feb. 2018 and entitled "Highly Scaled Linear GaN HEMT Structures", the disclosure of which is hereby incorporated herein by reference.

STATEMENT REGARDING FEDERALLY SPONSORED RESEARCH OR DEVELOPMENT

The present invention was made with support from the United States Government under contract number FA8650-18-C-7802 awarded by AFRL/DARPA. The United States Government has certain rights in the present invention.

TECHNICAL FIELD

This invention describes novel methods to create aggressively or highly scaled dual-gate devices for use within GaN HEMT amplifiers (power amplifiers and low noise amplifiers), with dimensions and operating frequency that are beyond the current state of the art (<1 μm gate-to-gate spacing and source-drain spacing). The term "highly scaled" refers to forming two gates where there is room generally for only one gate.

BACKGROUND

Dual-gate devices are well-known, however conventional gate fabrication techniques limit the degree that the devices can be scaled (in terms of gate length, gate-gate spacing, and source-drain spacing). The dimension of the gate head is on the order of 0.5 μm or larger in a conventional T-gate structure that is often used at higher frequencies. Thus, in the prior art, a 1.0 μm spacing between the device's source and drain allows only one gate for GaN HEMT devices.

Using a DC gate in a dual gate device allows for the reduction or elimination of the Drain to RF Gate capacitance. Ordinarily the capacitance between the drain and gate limits the bandwidth of the device. Adding a DC gate between the RF gate and the drain breaks a feedback path between the input RF Gate and the Drain of the device.

But limitations on device scalability, in addition to limitations imposed by the baseline transistor technology, then have put a limitations on the operating frequency of the prior art dual gate devices. For this reason, prior art dual-gate devices are seldom used at frequencies above X-band (10 GHz). The device disclosed herein will allow dual-gate devices to be utilized in MMICs at frequencies up to the W-band (70-110 GHz) and perhaps higher, and will enable better performance (in terms of gain, noise figure, and power added efficiency) than prior art devices.

Dual gate devices are potentially beneficial for any RF amplifier, but directly benefit high-linearity LNAs and traveling wave amplifiers, both of which derive very clear performance benefits from using dual-gate devices if they can be made to work at suitably high frequencies Dual-gate devices are well-known, however conventional gate fabrication techniques limit the degree that the devices can be scaled (in terms of gate length, gate-gate spacing, and source-drain spacing). Most fabrication processes that have been demonstrated in the literature simply use standard fabrication processes for the RF and DC gates within a dual gate structure. This will work for lower frequencies, but when aggressive scaling is needed (for higher frequencies) parasitic coupling between the gates can be a serious problem that will limit performance of the device.

A dual gate device is a transistor with two gate structures placed between a pair of source and drain contacts. This dual gate device operates like a "cascode" (a common-source followed by a common-gate transistor), except within a single device rather than two separate devices. See, Moon, J. S. et al., "70% Power-Added-Efficiency Dual-Gate, Cascode GaN HEMTs Without Harmonic Tuning", *IEEE Electron Device Letters*, Vol. 37, No. 3, March 2016, the disclosure of which is hereby incorporated herein by reference. The RF gate is placed closer to the source contact, and functions in the same way that a gate does within a standard common-source amplifier cell in that it receives the RF input signal. The DC gate is placed closer to the drain, and, in use, receives a constant DC voltage to enable operation as a common-gate device. This configuration is advantageous in that it increases output resistance and greatly reduces the Miller effect (amplification of the feedback capacitance caused by transistor voltage gain).

Traditionally dual-gate devices within GaN are designed using field-plate gates, and are intended to operate at microwave frequencies below 10 GHz. Achieving high-performance at mm-wave frequencies within a dual-gate device will require fabricating highly-scaled RF T-gates and it will require an unprecedented degree of lateral scaling between the RF and DC gates, both of which present significant fabrication challenges. In particular, it will be difficult to form both the RF and DC gates at the same time because resist undercut needed by standard bi-layer or tri-layer e-beam process will make it impractical to resolve the features in proximity that is closer than 1 to 2 μm.

Preferably, the intrinsic capacitance between the RF gate and the channel of the HEMT device is much larger than the parasitic capacitance between the RF gate and the DC gate.

BRIEF DESCRIPTION OF THE INVENTION

In the prior art a 1.0 micron spacing between the source and drain electrode has had the practical effect of allowing only one gate to formed for GaN devices. This invention provides for the formation of DC and RF the gates, preferably concurrently, and also allows a source to drain electrode spacing of one micron or less with the two gates in between the source and drain.

In one aspect the present invention provides a dual gate transistor, having source and drain regions and two gate electrodes, the lateral dimension between the two gate electrodes and between each gate electrode and an associated one of said source and drain regions being established only by lithographically set lateral dimensions (GS and $W_S$) and a thickness (S) of a sacrificial layer. The lateral spacing between the source and drain regions is less than 1 μm.

A four-terminal GaN transistor, containing source and drain electrodes and two gate electrodes.

The gate closer to the source electrode is a T-gate, and the proximity of the two gates is less than 500 nm.

A Dual gate GaN transistor where the spacing between the RF gate and source and the DC gate and drain are "self-aligned".

BRIEF DESCRIPTION OF THE DRAWINGS

FIG. 4(l) depicts the final portion of a preferred fabrication process of a self-aligned dual-gate device where a final layer of SiN passivation is deposited. Both the RF and DC gates at T-shaped in this embodiment.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

A dual gate device is a transistor with two gate structures placed between a set of source and drain contacts. The device operates like a "cascode" (a common-source followed by a common-gate transistor), except within a single device rather than two separate devices. The "RF gate" is placed closer to the source contact, and functions in the same way that a gate does within a standard common-source amplifier cell in that it receives the RF input signal. The "DC gate" is placed closer to the drain, and receives a constant DC voltage to enable operation as a common-gate device. This configuration is advantageous in that it increases output resistance and greatly reduces the Miller effect (amplification of the feedback capacitance caused by transistor voltage gain).

Traditionally dual-gate devices within GaN are designed using field-plate gates, and are intended to operate at microwave frequencies below 10 GHz. Achieving high-performance at mm-wave frequencies within a dual-gate device will require fabricating highly-scaled RF T-gates and it will require an unprecedented degree of lateral scaling between the RF and DC gates, both of which present significant fabrication challenges. In particular, if the prior art is followed, it will be difficult to form both the RF and DC gates at the same time because resist undercut needed by standard bi-layer or tri-layer e-beam process will make it impractical to resolve the features in proximity that is closer than 1 to 2 µm.

The following description begins with the disclosure of a non-self-aligned device (and a method of making same) and then follows with a self-aligned device (and a method of making same). As will be seen, the lateral dimensions of the self-aligned device are considerably better than those of the non-self-aligned device in that the drain to source spacing is much less than 1 µm (and as tight as about 250 nm in the disclosed embodiment). The drain to source spacing of the non-self-aligned device is better than that generally found in the prior art in that that spacing is somewhat less than 1 µm. However the self-aligned device is expected to operate at higher frequencies than the non-self-aligned device would be capable of given the even closer source-drain spacing which can be obtained.

A Non-Self-Aligned Device and Method

Figure 1A:
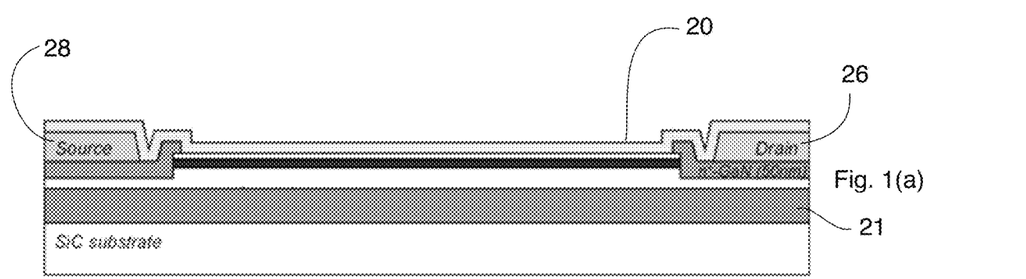
FIGS. 1(a)-1(c) depict a non-self-aligned fabrication process which starts with forming the DC gate where (1) SiN is deposited on the surface preferably by PECVD, (2) an e-beam lithography process and CF4-based dry etch are preferably used to selectively remove the SiN passivation from the DC gate region and then the e-beam resist is then removed; and (3) a second bi-layer e-beam process is used to evaporate and lift-off the DC gate metal thereby leaving the DC gate in place.

A proposed process flow for fabrication of a non-self signed embodiment of a dual-gate devices begins with FIG. 1(a). This document describes only the gate fabrication steps, and assumes that channel and barrier formation, ohmic contact fabrication and device isolation have already occurred in previous processing steps. The channel and barrier formation preferably follows that disclosed in U.S. Provisional Patent Application Ser. No. 62/630,688 filed 14 Feb. 2018, but conventional channel and barrier layers may alternatively be utilized. As such, the start of the fabrication process for a non-self-aligned dual gate device as described herein begins with the formation of the DC gate with a thin nm-thick layer 20 of SiN which is deposited on the exposed surfaces preferably by PECVD after ohmic contact fabrication of the drain and source contacts 26 and 28. In prior work, HRL Laboratories has found that depositing a layer of passivation on a planar surface (before gate lift-off) significantly reduces DC-RF dispersion in the final device.

Figure 1B:
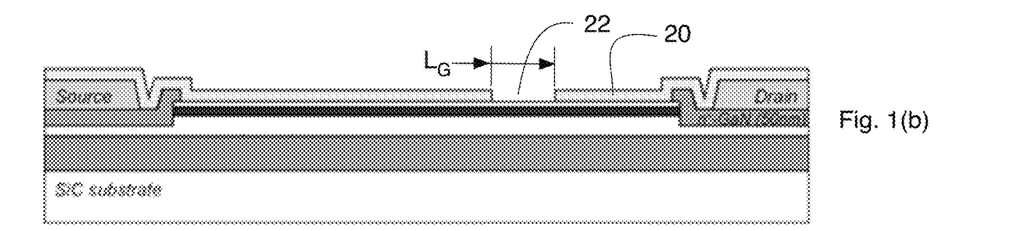

Then as shown in FIG. 1(b) a two step e-beam lithography process and a CF4-based dry etch are preferably used to selectively remove a portion of the SiN passivation layer 20 thereby creating an opening 22 in the SiN passivation layer 20 exposing the underlying material of the DC gate region.

The e-beam resist (not shown) utilized to define the opening 22 in layer 20 for the DC gate region is then removed. A layer of DC gate metal is formed on the layer 20 of SiN and over opening 22 and then a second bi-layer e-beam process is used to first evaporate and the lift-off excess DC gate metal thereby defining a DC gate 24 covering opening 22 in the DC gate region. In past work, HRL has found that depositing a layer of passivation on a planar surface (before gate lift-off) significantly reduces DC-RF dispersion in the final device. The DC gate 24 is preferably fabricated first using two e-beam lithography based steps:

(1) A positive tone e-beam resist (using resists such as ZEP520A or PMMA, not shown) is laid down followed by an appropriate etch (such as a CF4-based dry etch) to thereby define an opening 22 (see FIG. 1(b)) for the gate foot, the opening 22 having a lateral dimension $L_G$. The length $L_G$ of foot of the DC gate 24 (see FIG. 1(c)) is approximately 50 nm to 250 nm, with 100 to 150 nm being a more typically envisioned dimension range.

Figure 1C:
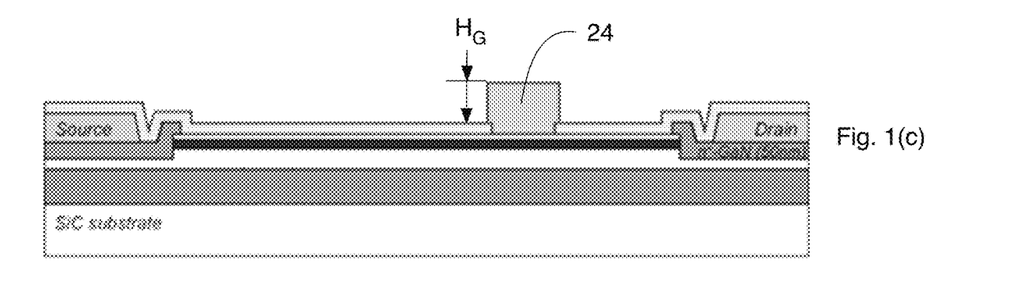

(2) Next a second a bi-layer e-beam lithography process is followed by a metal evaporation (Pt/Au or Ni/Au, for example) and a lift-off step to thereby form the DC gate 24 (see FIG. 1(c)). The lateral dimension written by this e-beam step is approximately 50 nm larger than what is written in the first step which formed opening 22 so the gate metal overlaps the SiN passivation layer 20 a bit.

Figure 2A:
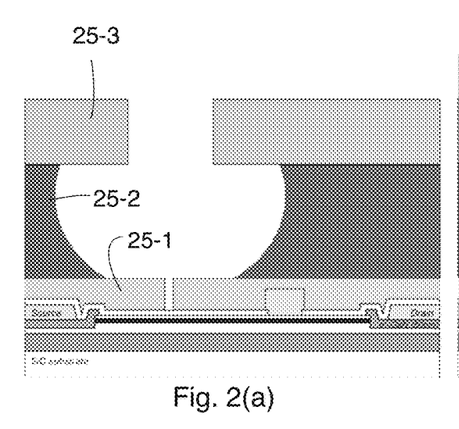
FIGS. 2(a) and 2(b) depict more of the non-self-aligned fabrication process which began with FIG. 1(a) and show the formation of the RF gate where (1) E-beam lithography is utilized to form a "T-gate" which involves a tri-layer e-beam process. The cross-section of the resist profile (see the three resist layers 25-1, 25-2 and 25-3) after lithography and development is shown in FIG. 2(a). After this, the SiN within the foot of the RF gate is etched using a CF4-based dry etch, and a Pt/Au (or Ni/Au) gate metal stack 30 is evaporated.
Figure 2B:
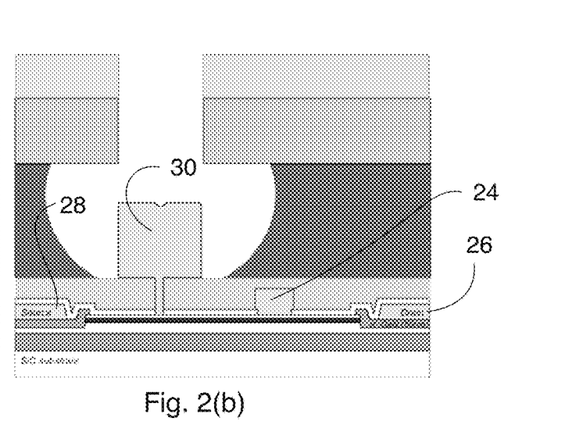

Within a dual-gate structure, gate resistance of the DC gate 24 is less critical to device performance than it is for the RF gate 30 (see FIG. 2(b), and so fabrication of the DC gate 24 consists of forming a more or less square (in plan view) gate that is approximately 200 nm thick (see dimension $H_G$ with a length $L_G$ of 100-150 nm on each side of the more or less square structure. Keeping the DC gate 24 relatively thin is important as maintaining a thin metal (with dimension $H_G$) during this step makes fabrication of the subsequent RF gate 30 easier.

Figure 3:
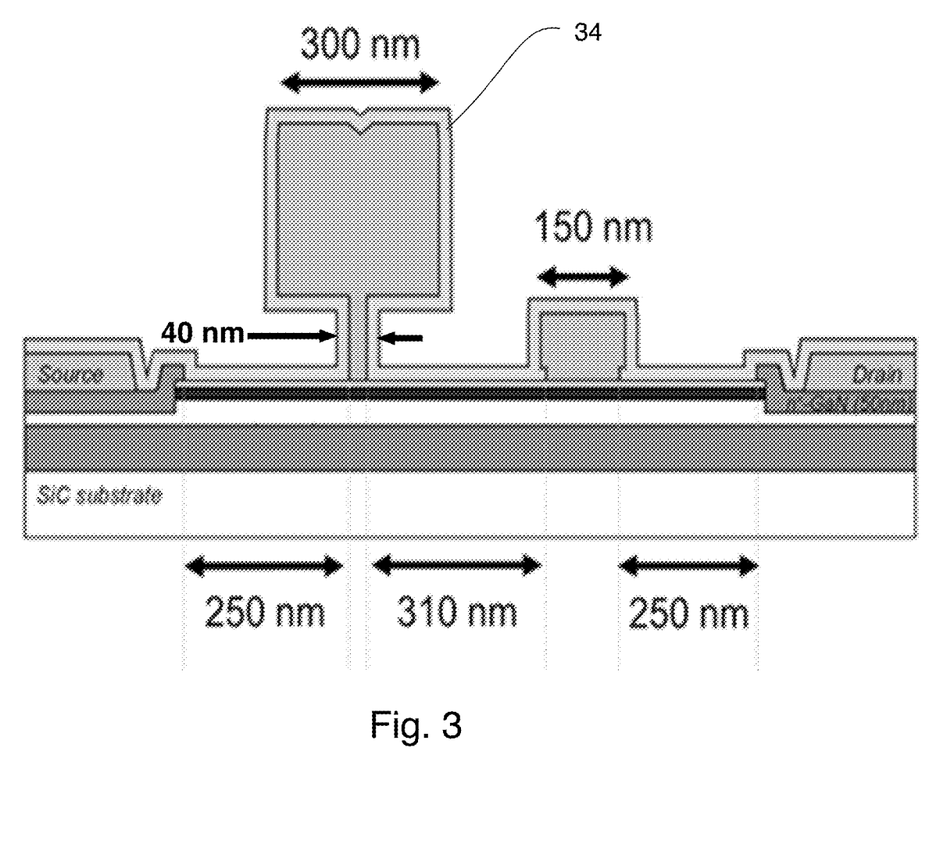
FIG. 3 depicts the completed dual-gate device according to the disclosed non-self-aligned fabrication process, after lift-off of the RF gate metal, and deposition of a final layer of SiN passivation. The dimensions shown in the this cross section view are preferred for a non-self-aligned device made according to the fabrication steps described with reference to FIG. 1(a) through FIG. 3.

The RF T-gate 30 is fabricated preferably using a ZEP/PMGI/ZEP tri-layer e-beam resist (see numerals 25-1, 25-2 and 25-3) process, which is a standard process used by HRL Laboratories in the fabrication of 40 nm GaN T3 devices, although other resist stacks are possible (including PMMA/MMA/PMMA for example). It is known that the surface topology can locally influence e-beam resist thickness during a spin coating procedure, which could alter this process. Our expectation is that the presence of the DC gate 24 will not alter the T-gate 30 formation process significantly because the DC gate metal 24 will be relatively thin and the resist behavior is more likely to be dominated by the presence of source and drain ohmic metal 28, 26. After the resist is developed, the SiN is dry-etched from the gate foot to form the RF gate foot, and the Pt/Au RF gate metal is evaporated, the metal is lifted off and a final layer 34 of SiN passivation is deposited (see FIG. 3). The thickness of the SiN passivation layers are chosen to prevent excessive capacitive coupling between the DC and RF gates. FIGS. 2(a), 2(b) and 3 show fabrication processes associated with the RF gate 26.

Those skilled in the art will appreciate the fact device of FIGS. 1(a) thru 3 results in an device fabrication technique which is not self-aligned. Devices which are self-aligned (either totally or even partially) will often be preferred as smaller device geometries can be obtained which can result in higher operating frequencies of the device.

A Self-Aligned Device and Method

The non-self-aligned embodiment of FIG. 3 is better than the prior art, but a self-aligned embodiment, which will now be discussed, allows for the source-drain spacing to be reduced even further. of course, a self-aligned dual-gate device requires a completely different device process than that discussed above. A self-aligned process discussed below which utilizes sacrificial gates with a "gate first" fabrication process (the gates are formed before the source and drain regions are formed). FIGS. 4(a) through 4(l) illustrate a fabrication process for a self-aligned dual gate HEMT. As in the case of the the non-self-aligned embodiment described above, this description begins with gate formation after ohmic contact fabrication of the drain and source contacts 26 and 28 and formation of the device layers under the gates.

The dual gate formation begins with the simultaneous forming of two sacrificial dummy gate structures 102 and 104 which are defined with a height preferably in a range of about 300 to 500 nm and a width ($W_S$) of about 50 to 150 nm directly on a device substrate 100 by e-beam lithography. The device substrate 100 may include a Scaled Graded Composite Channel as taught by U.S. Provisional Patent Application Ser. No. 62/630,688 filed on 14 Feb. 2018, referenced above. See FIG. 4(a). The two sacrificial dummy gate structures 102 and 104 are depicted as each having the same width $W_S$, but they may have differing widths, if desired. If the two sacrificial dummy gate structures 102 and 104 have different widths, then their metallic stems 127 will end up having differing widths as well. Preferably, width $W_S$ is selected as that the eventual widths of the gate stems 127 will end up being less than 40 to 50 nm wide.

Figure 4A:
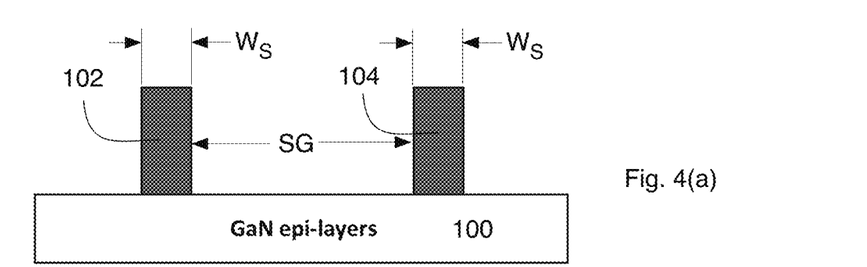
FIGS. 4(a)-4(c) depict an initial portion of a preferred fabrication process of a self-aligned dual-gate device where (1) a resist capable of a feature resolution less than 10 nm (such as Hydrogen silsesquioxane (HSQ)) is patterned by e-beam lithography, which is then used as a sacrificial gate for the process (2) a SiN sidewall is deposited around the device, and (3) E-beam resist is patterned over the two dummy gates and the SiN sidewall is removed using an isotropic CF4-based dry etch.

The sacrificial dummy gate structures 102 and 104 are formed of a resist preferably capable of a fine feature resolution preferably less than 10 nm. So Hydrogen Silsesquioxane (HSQ) is preferably used as the resist for sacrificial dummy gate structures 102 and 104. Since sacrificial dummy gate structures 102 and 104 are formed at the same time with a resist such as HSQ exhibiting fine feature control, the distance GS between the two sacrificial dummy gate structures 102 and 104 can be tightly controlled. As will be seen, the resulting distance $W_{GS}$ between the stems 127 of the gates and the distance S between the stems 127 of the each of the gates and the source and drain regions 114, 116 will be self-aligned and are based on the distances selected for $W_S$ and GS as well as the thickness S selected for layer 122.

Substrate 100 may be a GaN substrate suitable for use in making HEMT devices and thus may comprise a number of epitaxially formed layers known to those skilled in the art of making HEMT devices.

Figure 4B:
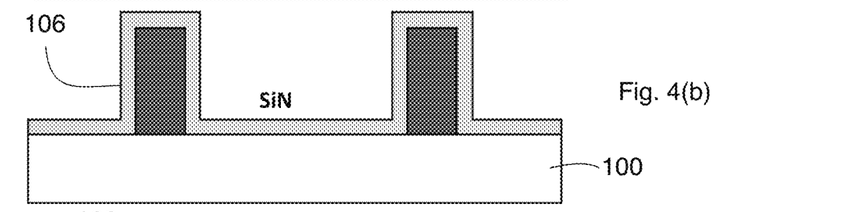
Figure 4C:
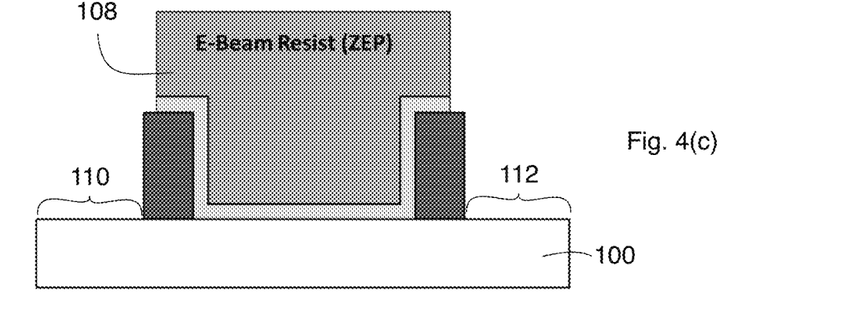

A dielectric mask 106 (such as SiN) is next deposited to a thickness (height) preferably in a range of about 100-200 nm on the exposed surface, which includes the sidewalls of the sacrificial dummy gate structures 102 and 104 (see FIG. 4(b)). Then, another e-beam lithography step (see FIG. 4(c)) is performed to protect the active device area between structures 102 and 104 and expose ohmic regions 110 and 112 of the device outboard of structures 102 and 104 using a patterned e-beam resist 108. An isotropic etch, such as a CF4-based etch, may be utilized to remove the SiN dielectric mask from the exposed regions, including the exposed outboard sidewalls of structures 102 and 104 and the ohmic regions 110 and 112, as is depicted by FIG. 4(c).

Figure 4D:
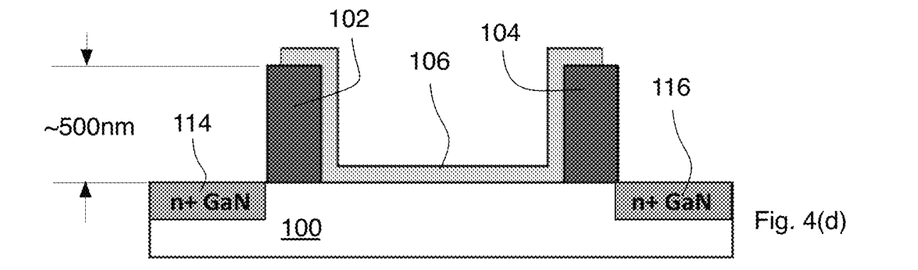
FIGS. 4(d)-4(f) depict a another portion of a preferred fabrication process of a self-aligned dual-gate device where the HSQ/SiN layers are used as a mask for recess etching and regrowth of n+ GaN in the ohmic regions and a thick (3000 Å) layer of SiN is then deposited, and the surface is planarized using CMP, such that the HSQ dummy gates are exposed.

Next, as is shown by FIG. 4(d), the patterned SiN dielectric 106 and sacrificial dummy gate structures 102 and 104 are used as a mask for a $Cl_2$ recess etch followed by MBE ohmic regrowth of n+ GaN, which forms the ohmic source region 114 and ohmic drain region 116 of the device.

Figure 4E:
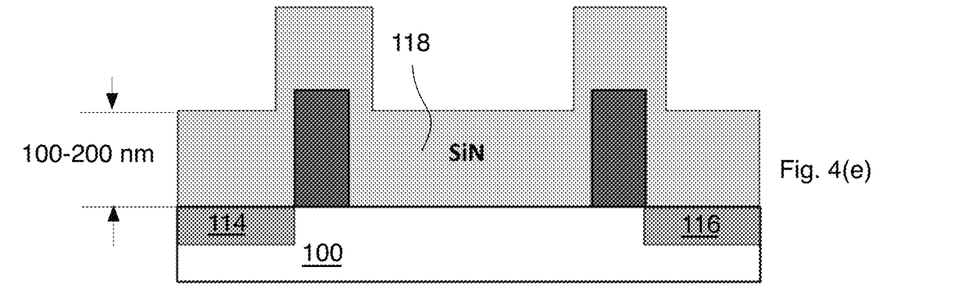
Figure 4F:
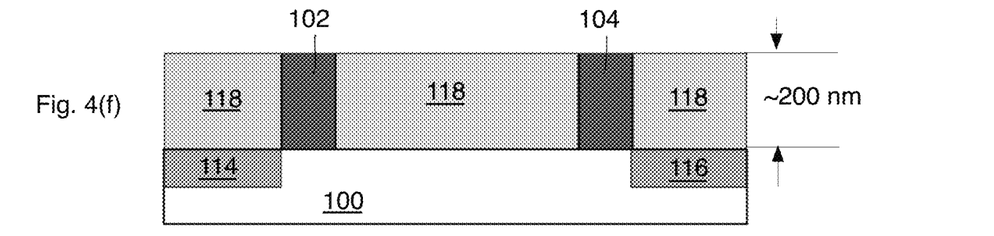

Turning to FIG. 4(e), a thick layer 118 of SiN is then deposited on the exposed surfaces. The thickness of layer 118 is chosen to provide a suitable height for eventual gate head(s) 128 and the thickness of layer preferably somewhat less than the height of sacrificial dummy gate structures 102 and 104. The exposed surface is then planarized (using CMP, for example) such that the top surfaces of the two HSQ dummy gates 102, 104 are exposed even with the planarized layer 118 (see FIG. 4(f)), the sacrificial dummy gate structures 102 and 104 thus ending up having a height of preferably about 200 nm after this planarization. As a result, the heads of the T-shaped RF and DC gates, when formed, will end up with their bottom edges being of that height (~200 nm) above substrate 100. The lengths of the dummy gate structures 102 and 104 will help define the lengths of the gate stems and if the DC gate 132 is formed without a stem, then the length of dummy gate structure 104 will help define the total length of that structure as well.

Figure 4G:
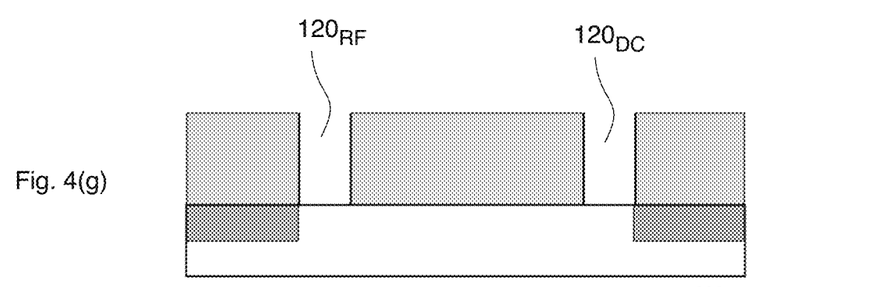
FIGS. 4(g)-4(i) depict a following portion of a preferred fabrication process of a self-aligned dual-gate device where: (1) The HSQ dummy gate is removed using a selective wet etch; (2) then an additional SiN sidewall layer is deposited to shrink the gate openings, which is followed by an anisotropic vertical CF4 dry etch; (3) A conformal layer of Pt is deposited by ALD, which acts as the gate Schottky contact as well as a plating membrane for electro-forming the gate head.
Figure 4H:
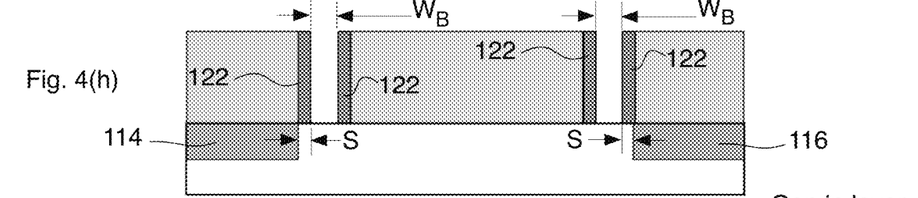

The sacrificial dummy gate structures 102 and 104 are then selectively removed (see FIG. 4(g)) using, for example, a HF-based wet etch. The openings $120_{RF}$ and $120_{DC}$ that remain are then preferably reduced in width using a sidewall shrink process (see FIG. 4(h)), which includes deposition of a conformal layer of SiN (or $SiO_2$) with thickness S of about 20-50 nm, and an anisotropic vertical dry etch using a CF4-based chemistry for example to remove the conformal layer of SiN (or $SiO_2$) from the horizontal surfaces and leaving SiN (or $SiO_2$) 122 with thickness of about 20-50 nm on the walls of openings $120_{RF}$ and $120_{DC}$ thereby forming sidewalls 122 of either SiN or $SiO_2$ on the four sidewalls. Opening $120_{RF}$ is used to help form the stem of the RF gate while opening $120_{DC}$ is used to help form stem of the DC gate (or the entire DC gate if not T-shaped). Thus, the lateral sizes (lengths) of these opening may be the same (as depicted) or different. The sidewall 122 forming step defines a spacing S between (i) the eventual RF gate and the source (at numeral 114) and between the eventual DC gate and the drain (at numeral 116). It also defines the width $W_B$ ($W_B$=$W_S$–2S) of the stems or bases of the yet-to-be formed T-shaped RF gate and the yet-to-be formed DC gate (which may be T-shaped as in the embodiment of FIG. 4(l) or not, if desired).

Figure 4I:
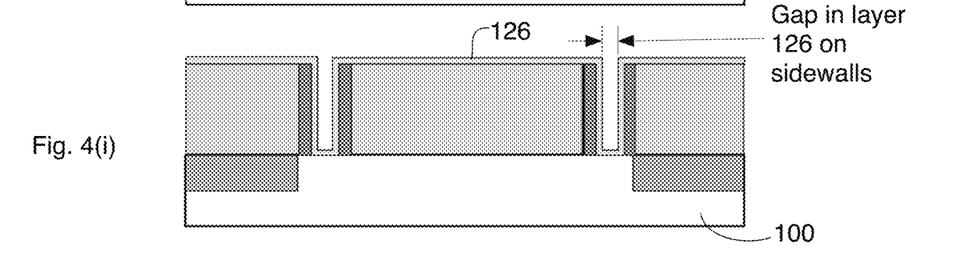
Figure 4J:
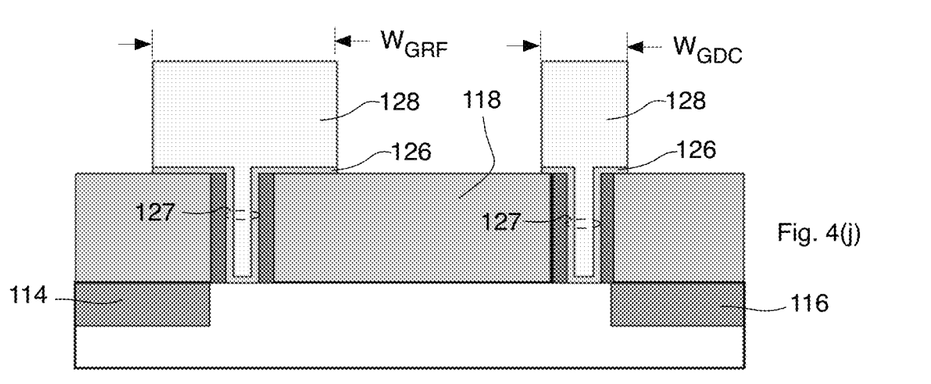
FIGS. 4(j) and 4(k) depict the next portion of a preferred fabrication process of a self-aligned dual-gate device where: (1) The Au gate head for both the DC and RF gates are patterned using a positive-tone e-beam lithography step, followed by Au electroplating and (2) the SiN dielectric is then fully removed using a HF-based wet etch, leaving the T-gates free-standing.
Figure 4K:
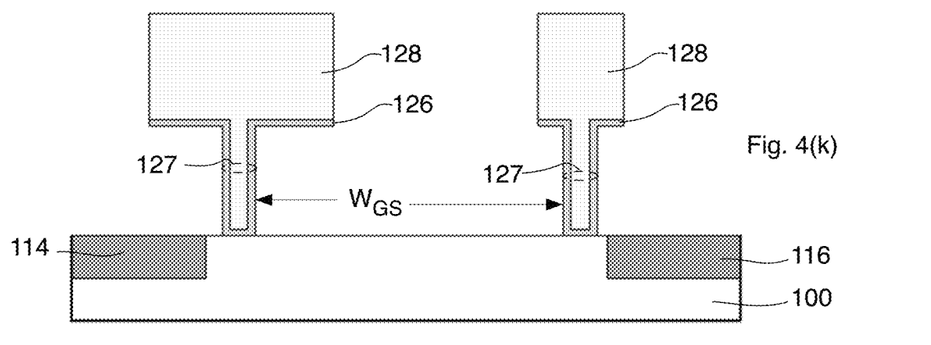

To metallize the gates (see FIG. 4(i)), a layer or membrane 126 of metal, preferably Pt, is deposited to a thickness of about 20 nm or more by ALD, which acts as Schottky gate metal and as a plating membrane for the metallization of the rest of the gate structures. Depending on the size of the opening for the stems or bases (with width $W_B$) of the yet-to-be formed T-shaped RF gates and the possibly T-shaped DC gate, metallic membrane 126 may adhere to the sidewalls leaving a narrow gap between the Pt on the sidewalls (as shown in FIG. 4(i)) or the metallic membrane 126 may completely fill the stem of base 127 (see FIG. 4(j)) of the yet-to-be formed T-shaped RF gate and the possibly T-shaped DC gate. An e-beam lithography step is then executed (see FIG. 4(j)) to define the widths $W_{GRF}$ and $W_{GDC}$ of the gate heads of yet-to-be-formed DC and RF gates, respectively, then gate metal 128 (Au for example) is electro-plated. The positive tone e-beam process for this step requires no resist undercut, and the DC gate head length $W_{GDC}$ does not need to be large, therefore the pitch (see the related dimension $W_{GS}$ which sets the distance between the two gate stems 127) of the two gates can be much finer than what can be achieved with conventional processing. Of course, if the DC gate is plated rather than T-shaped, then no gate head for the DC gate need be formed at this step.

For the final steps, the residual (exposed) metallic membrane 126 is removed using, for example, an ion mill step (which will also likely remove a small amount of the gate heads 128, but the gate heads 128 are significantly thicker than the residual metallic membrane 126 so that the ion milling removes all of the exposed metallic membrane 126 and only a small percentage of height of the Au gate heads 128. The remaining SiN 118 is then preferably removed (see FIG. 4(k)), preferably using an HF-based wet etch, and a final (thin ~20 nm) layer 128 of SiN passivation is deposited, preferably using PECVD, as is depicted by FIG. 4(l). FIG. 4(l) includes preferred sizes of various elements of the device. The sizes may be greater, but the frequencies at which the device can operate would then likely degrade (reduce).

This self-aligned embodiment (according to FIGS. 4(a)-4(l)) uses a self-aligned process for fabricating the two gates stems 127 and their locations vis-a-vis the n+ GaN source region 114 and the n+ GaN drain region 116 of the device. This self-aligned embodiment allows for an ultra-small dimension S (of about 20 nm, for example) between the stem 127 of the RF gate 130 and the source region 114 and between the stem 127 of the DC gate 132 and the drain region 116 because there is no lithographic realignment required—dimension S is based on the thickness of layer 122 as opposed to being based on the alignment tolerances of the equipment being used to fabricate the device. Lithographically defined dimensions include the resolution and minimum spacing GS between the two dummy gate structures of FIG. 4(a) and the spacing of the gate heads 128. The positioning of gate heads 128 on the stems 127 does rely on the alignment tolerances of the equipment being used, but if the gate heads 128 are not exactly centered on the stems 127 (as shown) that will not have a major impact on the functioning of the resulting device since the much more critical dimension S can be controlled by controlling the thickness of layer 122. The spacing between the gates stems (dimension $W_Gs$) is controlled by the lithographically defined dimension GS and the dimension S set by the thickness of layer 122. Alternative processes would be much more limited by alignment tolerances of the equipment being used to fabricate the device.

The DC gate 132 in this self-aligned embodiment may be made without a stem, for example, by increasing the length of opening 120$_D$c depicted in FIG. 4(*g*). But that could have the effect of increasing the distance between the source and drain regions 114, 116, it is preferred if the RF gate 130 and DC gate 132 are both T-shaped and if the RF gate 130 and DC gate 132 are both formed simultaneously as described herein.

The self-aligned embodiment of FIG. 4(*l*) results in the distance between the source and drain regions 114, 116 being as little as, for example, ~300 nm, and perhaps even smaller. The distances depicted on FIG. 4(*l*) can of course be adjusted as needed, but even the exemplary embodiment of FIG. 4(*l*) yields a 350 nm distance between the source and drain regions 114, 116, which should be very good for high frequency operations of the device and is a much smaller distance than found in prior art dual gate GaN transistors.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable.

Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A dual gate transistor, having source and drain regions and two gate electrodes, the lateral dimension between stems of the two gate electrodes and between the stems of each gate electrode and an associated one of said source and drain regions being established by lithographically set lateral dimensions and a thickness of a sacrificial layer thereby defining locations of the source and drain regions and stems of the two gate electrodes that are self-aligned with respect to each other.

2. A method of making dual gate transistor comprising:
    forming a substrate comprising one or more semiconductor layers;
    forming two sacrificial structures concurrently on said substrate;
    covering portions of the two sacrificial structures and a portion of the substrate with a resist material;
    forming source and drain regions in said substrate where the substrate is not covered by said resist material;
    removing the resist material;
    covering the two sacrificial structures and at least portion of the substrate with a first material;
    removing portions of the two sacrificial structures and portions of said first material which have a height exceeding some predetermined height above said substrate;
    removing remaining portions of the two sacrificial structures thereby defining two openings in said material, said openings having sidewalls formed of said first material;
    forming a second material on said sidewalls so that resulting openings occur where each sacrificial structure had been, which resulting openings being reduced in width compared to the first mentioned openings having sidewalls formed of said first material, the second material having a predetermined thickness;
    depositing a first metal in said resulting openings, the first metal at least partially filling said resulting openings, a sidewall portion of the first metal being spaced from a respective one of said source and drain regions by a distance substantially equal to said predetermined thickness;
    depositing a second metal over said first metal and filing said resulting openings if not previously filled by said first metal;
    removing potions of the second metal to thereby defines lengths and heights of a RF gate of said dual gate transistor and a DC gate said of dual gate transistor.

3. A method of making a dual gate transistor, said method including forming source and drain regions and two gate electrodes, a lateral dimension between centerlines of each gate electrode and an associated one of said source and drain regions being established by lithographically set lateral dimensions or lengths ($W_s$) of first and second instances of a first sacrificial material and a thickness (S) of a second sacrificial material, the first sacrificial material being removed prior to a completion of a formation of the two gate electrodes and second sacrificial materials being at least partially removed prior to a completion of a formation of the two gate electrodes.

4. The method of claim 3 wherein a lateral dimension between the two gate electrodes where they contact a substrate material is established by the lithographically set lateral spacing (SG) between the first and second instances of the first sacrificial material plus twice the thickness (S) of the second sacrificial material.

5. A four-terminal GaN transistor, having source and drain regions and two T-shaped gate electrodes, wherein a stem of one of the two T-shaped gate electrodes is more closely located to the source region than it is to a stem of the other one of the two T-shaped gate electrodes and wherein the stem of the other one of the two T-shaped gate electrodes is more closely located to the drain region than it is to the stem of said one of the two T-shaped gate electrodes and wherein a spacing between the two gates where they contact a substrate material is established by a lithographically set distance GS plus twice a thickness S of a sacrificial layer of material.

6. The four terminal GaN transistor of claim 5 wherein the stem of said one of the two T-shaped gate electrodes is spaced from said source region by a distance S equal to the thickness S of the sacrificial layer of material and wherein the stem of said other one of the two T-shaped gate electrodes is spaced from said drain region also by said distance S.

7. The four terminal GaN transistor of claim 6 wherein said distance S is established by a thickness of a layer of a sacrificial material which is removed during the manufacture of said four terminal GaN transistor.

8. A four-terminal GaN transistor, comprising source and drain regions and two gate electrodes wherein a one of the two gate electrodes closer to the source region is a T-shaped gate and a spacing between the two gates where they contact a substrate material is less than 500 nm to each other which is established by a lithographically set distance GS plus twice the thickness S of a sacrificial layer of material.

9. A four-terminal GaN transistor, having source and drain regions and at least one T-shaped RF gate electrode and at least one DC gate electrode, wherein a stem of the T-shaped gate RF electrode is more closely located to the source region than it is to the DC gate electrode and wherein the DC gate electrode is spaced from said drain region by essentially the same distance that the stem of the T-shaped gate RF electrode is spaced from the source region.

10. The four-terminal GaN transistor of claim 9 capable of operation in the W-band (75 to 100 GHz).

11. The four-terminal GaN transistor of claim 8 capable of operation in the W-band (75 to 100 GHz).

12. The four-terminal GaN transistor of claim 5 capable of operation in the W-band (75 to 100 GHz).

13. The four-terminal GaN transistor of claim 12 wherein a spacing between the two gates where they contact a substrate material is established by a lithographically set distance GS plus twice the thickness S of a sacrificial layer of material.

14. The four terminal GaN transistor of claim 5 wherein the stem of said one of the two T-shaped gate electrodes is spaced from said source region by a distance S and wherein the stem of said other one of the two T-shaped gate electrodes is spaced from said drain region also by said distance S, the distance S being set by said thickness S of the sacrificial layer of material.

\* \* \* \* \*